United States Patent
De Castro et al.

(10) Patent No.: US 11,004,649 B2
(45) Date of Patent: May 11, 2021

(54) ION SOURCE DEVICE

(71) Applicant: Luxembourg Institute of Science and Technology (LIST), Esch/Alzette (LU)

(72) Inventors: Olivier De Castro, Schifflange (LU); Serge Della-Negra, Orsay (FR); David Dowsett, Schuttrange (LU); Tom Wirtz, Grevenmacher (LU)

(73) Assignee: LUXEMBOURG INSTITUTE OF SCIENCE AND TECHNOLOGY (LIST), Esch/Alzette (LU)

( * ) Notice: Subject to any disclaimer, the term of this patent is extended or adjusted under 35 U.S.C. 154(b) by 0 days.

(21) Appl. No.: 16/488,984

(22) PCT Filed: Feb. 28, 2018

(86) PCT No.: PCT/EP2018/054956
§ 371 (c)(1),
(2) Date: Aug. 27, 2019

(87) PCT Pub. No.: WO2018/158329
PCT Pub. Date: Sep. 7, 2018

(65) Prior Publication Data
US 2020/0066476 A1    Feb. 27, 2020

(30) Foreign Application Priority Data
Feb. 28, 2017 (LU) .................................. LU100109

(51) Int. Cl.
*H01J 37/08* (2006.01)
*H01J 37/12* (2006.01)
(Continued)

(52) U.S. Cl.
CPC .............. *H01J 37/08* (2013.01); *H01J 37/12* (2013.01); *H01J 37/147* (2013.01);
(Continued)

(58) Field of Classification Search
CPC .. H01J 37/00; H01J 37/08; H01J 37/10; H01J 37/12; H01J 37/147; H01J 37/3007
(Continued)

(56) References Cited

U.S. PATENT DOCUMENTS 5,391,962 A    2/1995 Roberts et al.
6,998,622 B1 *  2/2006 Wang .................... H01J 49/147
                                                  250/281
(Continued)

FOREIGN PATENT DOCUMENTS

WO    2017/087470 A1    5/2017

OTHER PUBLICATIONS

International Search Report dated Jul. 10, 2018, PCT/EP2018/054956, 3 pages.
(Continued)

*Primary Examiner* — Jason L McCormack
(74) *Attorney, Agent, or Firm* — Rankin, Hill & Clark LLP

(57) ABSTRACT

The invention provides an electron-impact ion source device having high brightness as compared to known Nier-type ion sources, while providing similar advantages in terms of flexibility of the generated ion species, for example. The ionization chamber of the device operates at high pressures and provides for a large number of interactions between the electron beam and the gas molecules.

19 Claims, 1 Drawing Sheet

(51) Int. Cl.
  *H01J 37/147* (2006.01)
  *H01J 37/30* (2006.01)
(52) U.S. Cl.
  CPC ..... *H01J 37/3007* (2013.01); *H01J 2237/082* (2013.01); *H01J 2237/1504* (2013.01); *H01J 2237/31749* (2013.01)
(58) Field of Classification Search
  USPC .............................................. 250/288, 423 F
  See application file for complete search history.

(56) References Cited

U.S. PATENT DOCUMENTS

| | | | | |
|---|---|---|---|---|
| 2003/0003595 A1* | 1/2003 | Amirav | ................. | G01N 30/72 436/173 |
| 2004/0129876 A1* | 7/2004 | Franzen | ................. | H01J 49/16 250/288 |
| 2005/0258354 A1* | 11/2005 | Baba | ................... | H01J 49/0095 250/281 |
| 2005/0258364 A1 | 11/2005 | Whitehouse et al. | | |
| 2012/0012746 A1 | 1/2012 | Herrero et al. | | |
| 2013/0120894 A1 | 5/2013 | van Amerom et al. | | |
| 2014/0034828 A1* | 2/2014 | Senko | ................... | H01J 49/062 250/288 |
| 2014/0034844 A1 | 2/2014 | Ivashin et al. | | |
| 2016/0172146 A1* | 6/2016 | Wang | ................... | H01J 49/147 250/282 |
| 2017/0025264 A1 | 1/2017 | Sedlacek et al. | | |

OTHER PUBLICATIONS

International Search Report dated Jun. 28, 2019, PCT/EP2019/060449, 2 pages.

\* cited by examiner

ION SOURCE DEVICE

TECHNICAL FIELD

The invention lies in the field of ion source devices, for use in Focused Ion Beam applications such as FIB machining, imaging or sample analysis, for example by mass spectrometry.

BACKGROUND OF THE INVENTION

Focused Ion Beam, FIB, technology finds its application in three major activities, all three of which rely on the availability and use of finely focused ion beams.

FIB machining allows the manufacture of small nano-scale devices, for example through milling of materials. It further allows functionalizing surfaces with specific properties or creating nano-materials. FIB machining is further used as a sample preparation tool, e.g. for Transmission Electron Microscopy, TEM.

FIBs are also used in nano-imaging in order to perform three-dimensional sample investigations at the nanoscale. A well-established tool in this application field is the ORION™ Helium Ion Microscope, HIM. It uses He$^+$ and Ne$^+$ beams to perform high resolution ion-microscopy by detecting secondary electrons emitted from the sample surface.

For analytical purposes, Secondary Ion Mass Spectrometry, SIMS, represents a widely used and extremely powerful technique in order to perform chemical analysis of specimens. In SIMS, a focused primary ion beam is used to sputter material from a specimen and create localised secondary ion emissions, which can be analysed by different kinds of spectrometers. Cs$^+$, O$_2^+$ or O$^-$ ions represent typical reactive primary ion species used by SIMS as they enhance the emission of negative or positive secondary ions, respectively.

A common aspect of all of these afore mentioned FIB nano-applications is that they require high-brightness ion sources to provide finely focused ion beams for a high lateral resolution, while producing sufficiently high ion beam currents to obtain reasonable erosion rates as well as acceptable secondary electron/ion yields.

Brightness is an important figure of merit of an ion source. It is a conserved quantity, i.e., a high brightness ion source implies a high brightness beam and thus a small high current ion probe on the sample. Brightness is given by the following formula, wherein $d_{source}$ is the ion source diameter, and $\alpha_{Ion-beam}$ is the opening angle of the solid ion emission angle $\Omega$:

$$B = \frac{I_{Ion-beam}}{A_{Source} \cdot \Omega} \approx \frac{4 \cdot I_{Ion-beam}}{\pi^2 \cdot d_{Source}^2 \cdot \alpha_{Ion-beam}^2}$$

The normalised or reduced brightness $B_r$ is defined as follows, wherein $V_{Beam}$ is the beam potential:

$$B_r = \frac{B}{V_{Beam}} \approx \frac{4 \cdot I_{Ion-beam}}{\pi^2 \cdot d_{Source}^2 \cdot \alpha_{Ion-Beam}^2 \cdot V_{Beam}}$$

The reduced brightness is used in order to compare the performance of ion sources to each other. It is most commonly expressed in Am$^{-2}$ sr$^{-1}$ V$^{-1}$.

Furthermore, the energy spread of the generated ions should be kept as small as possible in order to minimise possible chromatic aberrations within the ion focussing column. The achievable ion probe size would be considerably increased by such chromatic aberrations. Another important fact is that the used ion species has a strong impact on many different parameters in all three afore mentioned application areas. For example, in ion beam machining applications, the ion species has a strong influence on etching effects, on the generation of surface roughness, as well as on milling rates which are related to the achieved sputtering yields. By implanting a given ion species into a substrate, a local modification of that substrate material can be achieved. In ion nano-imaging the produced secondary electron yields as well as the resolution of the image, which is closely related to the generated collision cascades within the sample, are influenced by the chosen ion species. Moreover, for analytical applications such as SIMS, the ionisation efficiency of the sputtered matter and therefore the sensitivity of the performed analysis is strongly related to the choice of the used primary ion species. Light ions are advantageous for imaging purposes as they result in small interaction volumes, heavy ions are advantageous for machining as they result in higher sputter yields, reactive ions are advantageous for analysis and they result in higher ion yields. The ability to rapidly switch between ion species depending on the desired application would be a significant advantage.

The most used high-brightness ion source for FIB-applications is the Liquid Metal Ion Source, LMIS. For high-resolution imaging, such as for HIM, the Gas Field Ion Source, GFIS, is primarily used to provide high-brightness ion beams. Both sources can provide ion beams with reasonable lifetimes but unfortunately they are limited in the commonly available choice of ion species. Ion sources with more versatility regarding the choice of ion species are Electron Impact, EI, or plasma ion sources. Unfortunately, so far these sources do not provide high-brightness ion beams comparable to the LMIS or GFIS.

EI ion sources are based on the simple principle of using an electron beam to remove atomic electrons from target gas particles and create in this way positively charged ions. Many known EI ion sources are based on the Nier-type EI ion source architecture, wherein a heated filament is used to generate an electron beam by thermionic emission. The electron beam then passes through an ionization chamber into which the gas that is to be ionized is fed at low gas pressure ($\leq 10^{-6}$ mbar) and the created ions are extracted perpendicular to the electron beam axis by applying a positive voltage to a repeller. In such known designs two permanent magnets are generally used to create an external magnetic field confining the electrons into a narrow beam with spiral trajectories directed towards an electron trap located at an opposed end of the ionization chamber, on the electron beam's axis. In some cases, instead of an electron trap, a reflector is used so that in addition the electron beam oscillates between filament and reflector. In this way, the electron path length is considerably increased and a higher ionization efficiency is obtained.

Due to the large ionization volume and the extraction mechanism, the reduced brightness as defined here above of such known EI source devices is limited, and typically of the order of 1 A m$^{-2}$ sr$^{-1}$ V$^{-1}$. In general terms, the brightness of an ion source is a function growing with the intensity of the generated ion current, and with the inverse of the source's ion emission area.

Axial electron impact ion source devices providing the mentioned limited brightness are known for example from patent documents US 2012/012746 A1, U.S. Pat. No. 5,391,962 A, US 2016/172146 A1 or US 2014/034844 A1. Ion carpets are disclosed in the context of ion sources in patent documents US 2013/120894 A1 and US 2005/258364 A1. The disclosed devices are structurally and functionally different from embodiments in accordance with the present invention.

Technical Problem to be Solved

It is an objective of the invention to present a device, which overcomes at least some of the disadvantages of the prior art. In particular, it is an objective of the invention to present an electron impact ion source capable of producing high-brightness ion beams of different ion species stemming from different source gases/feeds.

SUMMARY OF THE INVENTION

According to a first aspect of the invention an ion source device is provided. The ion source device comprises means for forming and guiding an electron beam along a first axis and an ionization chamber having an inlet for a gas and an inlet for said electron beam. The device is remarkable in that the ionization chamber comprises an ion beam outlet located on a second axis that is generally parallel to said first axis, or located substantially on said first axis, surrounded by an ion carpet comprising co-planar and substantially concentric electrodes for funneling ions formed by interaction of said electron beam with said gas towards said ion beam outlet to form an ion beam, and an electronic circuit configured for applying an electric potential to said electrodes.

Preferably, the second axis on which the ion beam outlet is located is the first axis along which said electron beam propagates.

Preferably, the electronic circuit may be configured for applying a radio-frequency, RF, electric potential to said electrodes. The electronic circuit may preferably be configured to apply a DC electric potential to said electrodes. The electric potential applied to different electrodes of the ion carpet may preferably not be the same. Preferably, neighbouring electrodes may be supplied with potentials having opposite phase. The potentials may preferably produce a standing wave. Preferably, the RF signals applied to said electrodes may have a frequency in the range of 1 to 12 MHz and an amplitude comprised between 0 and 150 V. Preferably, the electrodes may be supplied with an RF potential such that a phase offset exists between successive electrodes, so as to produce a travelling wave.

The ion carpet is preferably located inside the ionization chamber.

The electrodes of said ion carpet may preferably be supported on a substantially planar substrate having an aperture aligned with said ion beam outlet. Advantageously, the electrodes may be formed on a printed circuit board, PCB.

Further, the electrodes may preferably be supported on a first side of said substrate, and said electronic circuit may be supported on the second side of said substrate.

Preferably, said substrate may be an integral part of an internal wall of said ionization chamber.

Said co-planar and concentric electrodes may preferably be arranged to have interstices of different sizes, or widths between themselves. The electrodes may have different sizes, or widths.

Further preferably, the co-planar and concentric electrodes may have a substantially circular, rectangular or elliptic annular shape.

The ionization chamber may advantageously have a length comprised between 4 and 6 cm, and preferably of about 5 cm along the direction of said axis.

Preferably, the ionization chamber may comprise an electrode arrangement for creating an electromagnetic field in said ionization chamber, for slowing said electron beam down.

The ionization chamber may further preferably be operated at a pressure comprised between 0.01 mbar and 1 mbar, and preferably of about 0.1 mbar.

Preferably, the electron beam forming and guiding means may comprise an electron source and an arrangement comprising at least one electrostatic lens arranged for forming and guiding said electron beam.

The electron source may preferably comprise a disc cathode and heating means for heating said disc cathode.

Preferably, the electron beam forming and guiding means are configured to transport said electron beam at high energy, for example of several keV, up to the vicinity of the ionization chamber.

Preferably, the ion source device may further comprise at least one lens arranged on the outside of said ionization chamber and located so that an ion beam exiting the ionization chamber passes through said lens.

It is another object of the invention to provide a focused ion beam, FIB, device comprising an ion source, wherein said ion source conforms to the present invention.

The present invention suggests an architecture for building an electron impact ion source, which unlike conventional architectures, allows generating ion beams of high brightness, while leveraging at least one known advantage linked to electron impact sources, i.e., flexibility regarding the created ion species and the ability to rapidly switch between different ion species. An electron beam enters an ionization chamber into which a gas that is to be ionized is fed at relatively high pressure. Due to the high pressure, the number of gas molecules is increased as compared to known EI source architectures. This allows increasing the probability of interaction between the electron beam and the gas, yielding a large number of ions. The created ions are then extracted from the ionization chamber, in a direction that is coaxial to the electron beam, by means of an ion carpet funnel, to form an ion beam. The electron beam is transported at high energy along the major part of the electron beam guiding structure in order to obtain an efficient electron beam transmission into the ionization chamber. Only in close vicinity of and within the ionization chamber the electron beam is retarded in order to obtain a high ionization efficiency. Advantageously the electron beam is stopped within the ionization chamber, so that it does not hit the ion carpet's electrodes in order to keep the charge deposition on the electrodes as low as possible. The use of an ion carpet within the ionization chamber allows yielding a high ion beam current, yet at the same time it keeps the physical dimensions of the ionization chamber, and indeed of the ion source device, small. This renders the device according to the invention particularly useful for any applications which do not only require a high brightness ion beam, but also a small-footprint ion source device.

BRIEF DESCRIPTION OF THE DRAWINGS

Several embodiments of the present invention are illustrated by way of figures, which do not limit the scope of the invention, wherein FIG. 1 provides a schematic illustration of a lateral cut through a device in accordance with a preferred embodiment of the invention.

DETAILED DESCRIPTION OF THE INVENTION

This section describes the invention in further detail based on preferred embodiments and on the figures. Similar reference numbers will be used to describe similar or the same concepts throughout different embodiments of the invention. For example, references 100 and 200 respectively denote two different embodiments of the ion source device in accordance with the invention.

It should be noted that features described for a specific embodiment described herein may be combined with the features of other embodiments unless the contrary is explicitly mentioned.

Features commonly known in the art will not be explicitly mentioned for the sake of focusing on the features that are specific to the invention. For example, the ion source device in accordance with the invention is evidently powered by an electric supply, even though such supply is not explicitly referenced on the figures nor referenced in the description.

Figure 1:
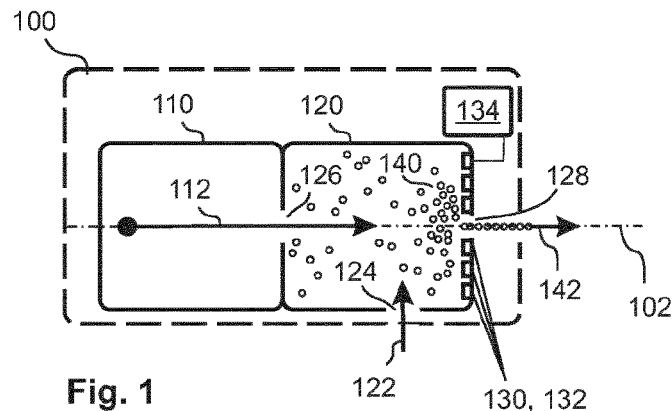

FIG. 1 shows an ion source device 100 in accordance with a preferred embodiment of the invention. It comprises means 110 for forming and guiding an electron beam 112 along an axis 102. The electron beam may for example be formed and shaped by means of a heated electron emitting filament and a collimating lens, as it is usual in the art. However, other electron beam forming and shaping means known in the art may as well be considered, without departing from the scope of the present invention. These may for example include Schottky emitters, in which a very sharp metal needle is located close to an extractor. A high potential difference between the needle and the extractor is then applied to generate a strong electric field at the tip of the needle, which causes electrons to escape from the metal tip. Electron beam shaping means may further be provided by electrostatic lenses, electrostatic multipoles, magnetic lenses or by electrodes surrounded by magnets, configured to generate electromagnetic fields that are capable of forming and guiding an electron beam. Along the axis 102 and following the travelling direction of the electron beam 112, an ionization chamber 120 is arranged. The ionization chamber 120 has an inlet 126 through which the electron beam 112 enters the chamber during operation of the device. The ionization chamber is further provided with an inlet 124 for selectively flowing a gas 122 of a chosen species into the enclosure of the ionization chamber. The molecules of the gas form the mother species of the ions that are to be formed by the ion source device, and no further restrictions on the nature of the used gas apply. Depending on the corrosiveness of the used gas or fragments thereof, the materials used within the ionization chamber need of course be chosen appropriately, so as to minimize the damage induced by the gas and/or ions on mechanical parts or internal coatings of the ion source device. The gas is chosen depending on the particular application in which the ion source device finds its use. Preferably, the pressure of the gas inside the ionization chamber is kept within a range of 0.01 to 1 mbar, thereby ensuring the presence of a large number of gas molecules within the ionization chamber during operation of the device. In order to maintain the gas pressure, the chamber is sealed using sealing means such as O-rings of appropriate dimensions and shapes, as they are commonly known in the art. Other sealing means may for example comprise connections as those known from the firm Swagelok™, in which threaded connectors, a sealing disc and a counterpart nut with an interior thread are used to provide a sealed connection. The wall of the ionization chamber that opposes the wall through which the electron beam 112 enters the ionization chamber comprises an ion beam outlet 128 aligned on said axis 102.

The ion beam outlet 128 is the only aperture through which ions 140 created through interaction of the electron beam 112 and the gas inside the ionization chamber 112 may escape the latter. While ions 140 are shown primarily in the vicinity of the ion carpet 130, it is understood that ions are created throughout the ionization chamber 120. They concentrate towards axis 102 as they get closer to the ion carpet 130.

In order to funnel the ions 140 toward the outlet 128, a set of concentric electrodes 132 forming an ion carpet 130 is arranged around the outlet. An ion carpet is an ion optical element. The electrodes 132 have a substantially annular shape and their respective centres coincide with the location of the ion beam outlet 128. The annular electrodes preferably have alternating radiofrequency RF waveforms applied to them (180 degrees out of phase from electrode to electrode). In that case, the RF field creates an effective potential that is repulsive to ions, but only at very close proximity to the electrodes themselves. This short-range repulsion can be used to essentially make the ions hover over the carpet at very close distances. In the exemplary and non-limiting case wherein a standing RF wave is applied to the electrodes of the ion carpet, ions would simply hover over the electrodes; there would be no motivation for them to move to one part of the carpet or another. In order to further manipulate the hovering ions, an additional DC gradient may be applied. Typically the DC gradient is applied such that the centermost ring is at the most "downhill" DC potential for the ions of interest (e.g. the lowest potential for positive ions or highest potential for negative ions).

The gradually changing DC potentials cause ions to be pulled toward the center electrode while the RF keeps them perpetually hovering. As a result, a large fraction of the ions converge toward the centermost annular electrode. The electric potential applied to said electrodes 134 is defined by an electronic circuit 134 that may advantageously be programmed to provide different electric potentials to the different electrodes 132.

Figure 2:
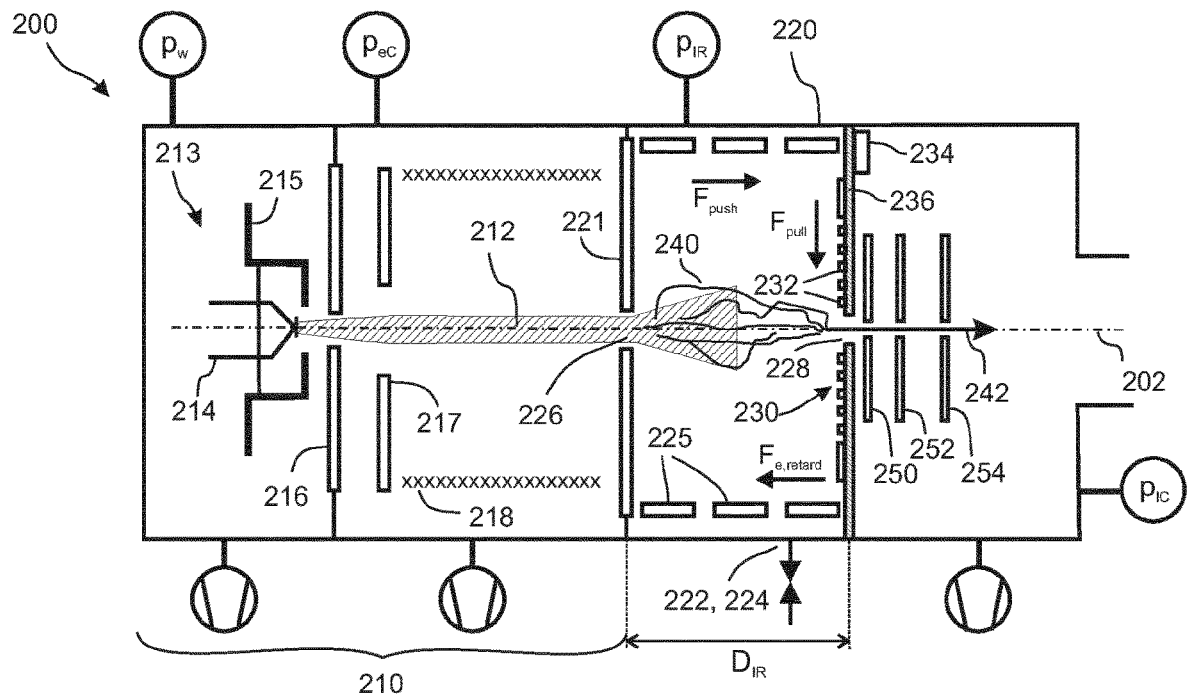
FIG. 2 provides a schematic illustration of a lateral cut through a device in accordance with a preferred embodiment of the invention.

FIG. 2 shows an ion source device 200 in accordance with another preferred embodiment of the invention. The different sections of the device follow each other along the axis 202 in the direction of electron/ion propagation. Each section is provided with pressure regulating means comprising inlet/outlet valves and seals as known in the art, in order to allow applying pressure gradients from one section to the next. The device 200 comprises means 210 for forming and guiding an electron beam 212 along an axis 202.

The electron beam is formed by an electron source 213 comprising a heated disc cathode 214 in conjunction with a Wehnelt electrode 215 and an extraction anode 216 having a central aperture through which the electron beam may pass. A heater of the disc cathode 214 comprises for example an electric power supply that applies a potential difference across the cathode, thereby causing a heating generating electric current, of an intensity of up to several Ampere, to flow. Advantageously, the disc cathode 214 is an yttria-coated iridium ($Y_2O_3$—Ir) disc cathode. Such cathodes have a typical emission current density of 0.5 A/cm², a typical operation temperature of about 1800 K, a work-function of $\phi$=2.6 eV and emission areas of $5.5 \cdot 10^{-3}$ cm² to $1.95 \cdot 10^{-2}$ cm² depending on the cathode disc diameter. The emitted electron current can be of several mA and an advantage of this kind of emitter is that they can be operated in quite poor vacuum conditions as their recommended operation pressure is p≤$10^{-4}$ mbar. The electron beam is preferably transported at high energy of several keV along axis 202. The electron beam is collimated by the electrostatic lens 217 before it enters the ionization chamber 220 through the inlet 226 at a lower energy of about 100 eV. The electron beam forming chamber is preferably surrounded by a potential shielding and pumping grid 218, as illustrated. The grid may for example be provided as a metal grid embedded in a ceramic support structure, which supports all shown components of the device 200 and provides insulation between them. The electron beam forming chamber and the ionization chamber 220 are preferably separated by an electrode 221 having an aperture coinciding with the inlet 226.

The ionization chamber 220 is further provided with an inlet 224 for selectively flowing a gas 222 of a chosen species into the enclosure of the ionization chamber. While other settings may be applied without leaving the scope of the present invention, the pressure of the gas inside the ionization chamber is preferably kept at about 0.1 mbar, at a temperature which is kept at about 298.15 K.

The wall of the ionization chamber that opposes the wall through which the electron beam 212 enters the ionization chamber comprises an ion beam outlet 228 aligned on said axis 202. The ion beam outlet 228 is the only aperture through which ions 240 created through interaction of the electron beam 212 and the gas inside the ionization chamber 212 may escape the latter. In order to funnel the ions 240 toward the outlet 228, a set of concentric electrodes 232 forming an ion carpet 230 is arranged around the outlet. The electrodes 232 have a substantially annular shape and their respective centres coincide with the location of the ion beam outlet 228. The electric potential applied to said electrodes 234 is defined by an electronic circuit 234. In the example of FIG. 2, the electrodes 232 are supported on a substrate 234 that either covers or forms the corresponding wall of the ionization chamber 220.

As the electron beam 212 enters the ionization chamber 220, it is retarded and advantageously stopped within the ionization region, by a combination of its interaction with the gas molecules, and the effect of the stopping field $F_{e,retard}$. The strength of the latter may for example be chosen to be of about 10 V/cm. The stopping field is preferably generated by the RF electric potentials applied to the electrodes 232 of the ion carpet 230, preferably in combination with at least one further electrode, e.g., electrode 221, dedicated to that effect. The inventors have observed that given the exemplary set of parameters ($p_{IR}$=0.1 mbar, $T_{IR}$=298.15 K and $F_{e,retard}$=10 V/cm), an electron beam having energy of 100 eV and entering the ionization chamber 220 is stopped within a distance of less than 4 cm along axis 202 irrespective of the nature of the gas with which it interacts (He, Ne, Ar, Kr, Xe, $O_2$, $N_2$). Therefore, the length of the ionization chamber Dm along the direction of axis 202 is preferably chosen to be of about 5 cm. If the electron beam is stopped within the ionization chamber 220, its electrons do not hit the ion carpet and the count of interactions with gas molecules is increased.

The electric potential applied to the electrodes 232 of the ion carpet 230, in combination with the electric potentials on electrodes 221 and 225, further push the created ions towards the ion carpet. Near the ion carpet, the ions 240 are pulled or funneled toward the central ion beam aperture 228.

This is achieved by superposing a DC gradient on the ion carpet's electrodes. In the illustrated example, the potential shielding electrodes 225 further surround the ionization chamber 220. The potentials of these electrodes may be chosen at several kV, however, the potentials are advantageously lower than the potential applied to electrode 221. The difference in potential between electrodes 225 and electrode 221 is preferably of the order of tens of Volts.

In the example of FIG. 2, the ionization chamber is followed by an ion column comprising at least one electrode 250, but preferably three electrodes 250, 252 and 254 forming a lens, wherein the latter is preferably set at ground potential. The potential difference between electrode 221 (typically set at several kV, e.g., 5 kV) and electrode 254 fixes the energy of the ion beam as it leaves the ion source device. Electrode 250 should preferably be set at a potential that is lower than the main DC-potential of the ion carpet, in order to create an extraction field for the positive ions. Nevertheless, its potential can still be of several kV. Electrode 252 is kept at a potential that is positive, but lower than the potential of electrode 250.

The electrode 250 preferably acts as a diaphragm having a small aperture (about 100 μm) with respect to the dimensions of the aperture 228 (about 1 mm) forming the ion beam outlet. This arrangement allows the ion source device 200 to output an ion beam having high brightness, corresponding to the central part of the emission cone exiting the ion beam outlet 228.

Figure 3:
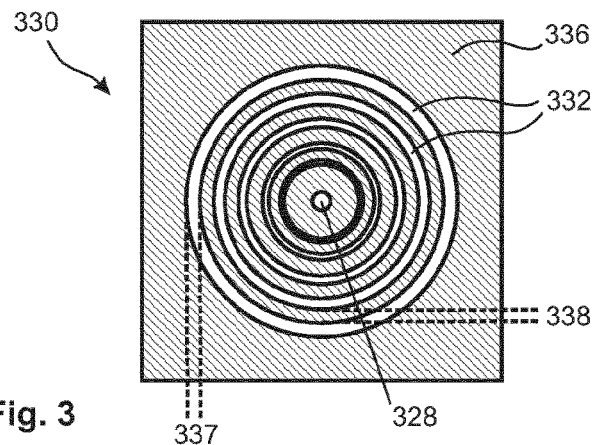
FIG. 3 provides a schematic illustration of frontal view of an ion carpet in accordance with a preferred embodiment of the invention

FIG. 3 provides a schematic illustration of an ion carpet 330 as it is used within the ionization chamber of an ion source device in accordance with embodiments of the invention. In this exemplary embodiment, circular shaped annular electrodes 332 extend over a total diameter of about 4 cm and are centred about an aperture 328 having a diameter of about 1 mm in the substrate 336. While FIG. 3 shows the substrate 336 as having a square shape, other shapes, such as a rounded or circular shape may be used without departing from the scope of the present invention.

The ion carpet 330 is for example produced using printed circuit board, PCB, technology, wherein copper electrodes are deposited in several steps onto an electrically insulating resin. The electrodes 332 are connected to an electric circuit that is preferably located on the reverse side of the PCB, which is not visible on FIG. 3. The connections between components on either side of the planar substrate are established by through holes or vias filled with copper. While the shown electrodes have a circular shape, they may as well have square, rectangular, elliptic or other shapes without departing from the scope of the present invention. In the example of FIG. 3, the electrodes 332 have different widths 337 and interstices 338 of different sizes. In other embodiments, either or both parameters may be equal among the electrodes. The RF signals applied to the RF ion carpet 330 are preferably in the frequency range spanning 1 to 12 MHz and have an amplitude in the range of 0 to 150 V, preferably of about 100V. The design of electronic circuits allowing the provision of such signals is deemed to lie within the ordinary capabilities of the skilled practitioner, and will not be described in further details in the context of the present invention.

It has been observed that the reduced brightness, as defined here above, of an electron impact source in accordance with embodiments of the present invention, is of about 100 to 500 A m$^{-2}$ sr$^{-1}$ V$^{-1}$. This represents an improvement by a factor of 100 to 500 as compared to state of the art electron impact sources.

It should be understood that the detailed description of specific preferred embodiments is given by way of illustration only, since various changes and modifications within the scope of the invention will be apparent to the person skilled in the art. The scope of protection is defined by the following set of claims.

The invention claimed is:

1. An ion source device comprising means for forming and guiding an electron beam along a first axis and an ionization chamber having an inlet for a gas and an inlet for said electron beam, wherein the ionization chamber comprises an ion beam outlet located on a second axis that is generally parallel to said first axis, surrounded by an ion carpet comprising co-planar and substantially concentric annular electrodes for funneling ions formed by interaction of said electron beam with said gas towards said ion beam outlet to form an ion beam, and an electronic circuit configured for applying an electric potential to said electrodes.

2. The ion source device according to claim 1, wherein said electronic circuit is configured for applying a radio-frequency electric potential to said electrodes.

3. The ion source device according to claim 1, wherein said electronic circuit is configured for applying DC electric potentials to said electrodes.

4. The ion source device according to claim 1, wherein the electrodes of said ion carpet are supported, on a substantially planar substrate having an aperture aligned with said ion beam outlet.

5. The ion source device according to claim 4, wherein said electrodes are supported on a first side of said substrate, and wherein said electronic circuit is supported on the second side of said substrate.

6. The ion source device according to claim 4, wherein said substrate is an integral part of an internal wall of said ionization chamber.

7. The ion source device according to claim 1, wherein said co-planar and concentric electrodes are arranged to have interstices of different sizes between themselves.

8. The ion source device according to claim 1, wherein said co-planar and concentric electrodes have different sizes.

9. The ion source device according to claim 1, wherein said co-planar and concentric electrodes have a substantially circular, rectangular or elliptic annular shape.

10. The ion source device according to claim 1, wherein said ionization chamber has a length comprised between 4 and 6 cm along the direction of said first axis.

11. The ion source device according to claim 1, wherein said ionization chamber comprises an electrode arrangement for creating an electric field in said ionization chamber, for slowing said electron beam down.

12. The ion source device according to claim 1, wherein said ionization chamber is operated at a pressure comprised between 0.01 mbar and 1 mbar.

13. The ion source device according to claim 1, wherein said electron beam forming and guiding means comprise an electron source and an arrangement comprising at least one electrostatic lens arranged for forming and guiding said electron beam.

14. The ion source device according to claim 13, wherein said electron source comprises a disc cathode and heating means for heating said disc cathode.

15. The ion source device according to claim 1, wherein the ion source device further comprises at least one lens arranged on an outside of said ionization chamber and located so that an ion beam exiting the ionization chamber passes through said lens.

16. A focused ion beam device comprising an ion source, wherein said ion source is according to claim 1.

17. The ion source device according to claim 10, wherein said ionization chamber has a length of about 5 cm along the direction of said first axis.

18. The ion source device according to claim 12, wherein said ionization chamber is operated at a pressure of about 0.1 mbar.

19. The ion source device according to claim 1, wherein said ionization chamber comprises a stopping electrode for creating an electric field in said ionization chamber, and wherein the stopping electrode is upstream of said ion carpet.

* * * * *